(12) United States Patent
Kim et al.

(10) Patent No.: US 11,758,755 B2
(45) Date of Patent: Sep. 12, 2023

(54) DISPLAY DEVICE INCLUDING SUBSTRATE WITH POLYMERIC FILMS

(71) Applicant: Samsung Display Co., Ltd., Yongin-si (KR)

(72) Inventors: Keunwoo Kim, Seongnam-si (KR); Hyena Kwak, Suwon-si (KR); Taewook Kang, Seongnam-si (KR); Jiyeong Shin, Suwon-si (KR); Jaeseob Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

(21) Appl. No.: 17/228,586

(22) Filed: Apr. 12, 2021

(65) Prior Publication Data
US 2021/0367209 A1    Nov. 25, 2021

(30) Foreign Application Priority Data
May 21, 2020    (KR) .......................... 10-2020-0061208

(51) Int. Cl.
| | | |
|---|---|---|
| H01L 27/12 | (2006.01) | |
| G02F 1/13 | (2006.01) | |
| H10K 50/844 | (2023.01) | |
| G02F 1/1333 | (2006.01) | |
| H10K 50/816 | (2023.01) | |

(Continued)

(52) U.S. Cl.
CPC ..... *H10K 50/844* (2023.02); *G02F 1/133334* (2021.01); *G09G 2300/0408* (2013.01);
(Continued)

(58) Field of Classification Search
CPC ............. H01L 51/5253; H01L 51/0097; H01L 51/5246; H01L 51/5215; H01L 51/5234; H01L 2251/5338; H01L 2251/301; H01L 2251/558; H01L 27/3262; H01L 27/3246; H01L 27/3248; H01L 27/3258; H01L 27/3265; H01L 27/1218; H01L 27/1222; H01L 27/124; H01L 27/3276; H01L 27/3272; H01L 27/3295; G02F 1/133334; G09G 2300/0408; G09G 2300/0804; H10K 50/844; H10K 50/816; H10K 50/828; H10K 50/8426; H10K 59/126; H10K 59/35;
(Continued)

(56) References Cited

U.S. PATENT DOCUMENTS 9,305,984 B2    4/2016    Kang
9,634,074 B2    4/2017    Son et al.
(Continued)

FOREIGN PATENT DOCUMENTS

KR    10-2014-0090857 A    7/2014
KR    10-2015-0052645 A    5/2015
(Continued)

*Primary Examiner* — Ida M Soward
(74) *Attorney, Agent, or Firm* — Lewis Roca Rothgerber Christie LLP

(57) ABSTRACT

A display device includes: a base substrate including a first polymeric film; an active pattern on the base substrate and including a first channel region; and a first gate electrode overlapping the first channel region, wherein the first polymeric film has a first thickness in a first area overlapping the first channel region and a second thickness, which is smaller than the first thickness, in a second area different from the first area.

25 Claims, 10 Drawing Sheets

(51) Int. Cl.
*H10K 50/828* (2023.01)
*H10K 50/842* (2023.01)
*H10K 59/35* (2023.01)
*H10K 59/126* (2023.01)
*H10K 102/00* (2023.01)

(52) U.S. Cl.
CPC ... *G09G 2300/0804* (2013.01); *H10K 50/816* (2023.02); *H10K 50/828* (2023.02); *H10K 50/8426* (2023.02); *H10K 59/126* (2023.02); *H10K 59/35* (2023.02); *H10K 2102/00* (2023.02); *H10K 2102/351* (2023.02)

(58) Field of Classification Search
CPC .......... H10K 59/1213; H10K 59/1216; H10K 59/123; H10K 59/124; H10K 59/122; H10K 59/131; H10K 77/111; H10K 2102/00; H10K 2102/351
See application file for complete search history.

(56) References Cited

U.S. PATENT DOCUMENTS

| | | | |
|---|---|---|---|
| 11,056,509 B2 * | 7/2021 | Je | H01L 27/1225 |
| 11,251,247 B2 * | 2/2022 | Kim | H01L 21/47573 |
| 2005/0189535 A1 * | 9/2005 | Hsueh | H01L 51/5284 257/40 |
| 2005/0242398 A1 * | 11/2005 | Chen | H01L 27/1203 438/479 |
| 2005/0253506 A1 * | 11/2005 | Tsai | H01L 27/322 313/506 |
| 2015/0269902 A1 * | 9/2015 | Hong | G02F 1/133371 345/88 |
| 2018/0090698 A1 * | 3/2018 | Jeong | H01L 51/003 |
| 2018/0366586 A1 * | 12/2018 | Son | H10K 59/1213 |
| 2019/0006521 A1 * | 1/2019 | Noh | H01L 29/41733 |
| 2019/0189721 A1 * | 6/2019 | Kim | H01L 27/1248 |
| 2019/0189722 A1 * | 6/2019 | Lim | H10K 59/1216 |
| 2020/0105799 A1 * | 4/2020 | Yuan | H01L 27/124 |
| 2020/0144309 A1 * | 5/2020 | Jeon | H01L 27/1222 |
| 2021/0013280 A1 * | 1/2021 | Choi | H10K 59/1216 |
| 2021/0036029 A1 * | 2/2021 | Park | H10K 59/1201 |
| 2021/0050398 A1 * | 2/2021 | Kim | H10K 59/1201 |
| 2021/0104558 A1 * | 4/2021 | Kim | H10K 59/1213 |

FOREIGN PATENT DOCUMENTS

| | | |
|---|---|---|
| KR | 10-2016-0096760 A | 8/2016 |
| KR | 10-2019-0002237 A | 1/2019 |

* cited by examiner

DISPLAY DEVICE INCLUDING SUBSTRATE WITH POLYMERIC FILMS

CROSS-REFERENCE TO RELATED APPLICATION

The present application claims priority to and benefit of Korean Patent Application No. 10-2020-0061208 filed on May 21, 2020 in the Korean Intellectual Property Office, the entire content of which is incorporated herein by reference.

BACKGROUND

1. Field

Aspects of embodiments of the present disclosure relate to a display device.

2. Description of the Related Art

A polymeric substrate may be utilized for a display device to reduce weight of a display device and to vary designs of a display device. A polymeric substrate may include a polymer such as polyimide or the like.

When a display device includes a polymeric substrate, dipole polarization may be induced by an electric signal applied to a driving element or the like, and may cause deterioration of display quality, for example, after-image.

The above information disclosed in this Background section is only for enhancement of understanding of the background and therefore the information discussed in this Background section does not necessarily constitute prior art.

SUMMARY

Aspects of embodiments of the present disclosure relate to a display device. For example, aspects of embodiments relate a display device that may have relatively improved display quality.

Aspects of embodiments relate to a display device with relatively improved display quality.

According to embodiments of the present disclosure, a display device includes a base substrate including a first polymeric film, an active pattern on the base substrate and including a first channel region, and a first gate electrode overlapping the first channel region. The first polymeric film has a first thickness in a first area overlapping the first channel region and a second thickness, which is smaller than the first thickness, in a second area different from the first area.

According to embodiments, the display device further includes a second gate electrode overlapping a second channel region of the active pattern. The second area overlaps the second channel region.

According to embodiments, the display device further includes a light-emitting element. A driving transistor defined by the first channel region and the first gate electrode provides a driving current to the light-emitting element. A source terminal or a drain terminal of a switching transistor defined by the second channel region and the second gate electrode is electrically connected to a source terminal or a drain terminal of the driving transistor.

According to embodiments, an emission control signal is applied to the second gate electrode.

According to embodiments, the light-emitting element includes an organic light-emitting diode.

According to embodiments, a ratio of the first thickness to the second thickness is at least about 1.2.

According to embodiments, a difference between the first thickness and the second thickness is about 5,000 Å to about 20,000 Å.

According to embodiments, the base substrate further includes a second polymeric film under the first polymeric film, and an adhesion-enhancing layer, which is between the first polymeric film and the second polymeric film and includes amorphous silicon.

According to embodiments, the display device further includes a capacitor electrode pattern, wherein an edge of the first area extends along an edge of the capacitor electrode pattern.

According to embodiments, the active pattern further includes a second channel region overlapping the second area, wherein a height of the first channel region is greater than a height of the second channel region.

According to embodiments of the present disclosure, a display device includes a base substrate, an active pattern on the base substrate and including a first channel region, and a first gate electrode overlapping the first channel region. The base substrate includes a first polymeric film, a second polymeric film and an adhesion-enhancing layer, which is between the first polymeric film and the second polymeric film and includes an opening. The first channel region overlaps the opening of the adhesion-enhancing layer.

According to embodiments, a display device includes a base substrate, a field-blocking pattern, an active pattern on the base substrate and a first gate electrode. The base substrate includes a first polymeric film and an upper barrier layer covering an upper surface of the first polymeric film. The field-blocking pattern is partially between the first polymeric film and the upper barrier layer. The active pattern is on the base substrate, overlaps the field-blocking pattern and includes a first channel region spaced apart from the field-blocking pattern by a distance equal to or more than 5,000 Å. The first gate electrode overlaps the first channel region.

According to embodiments, a fringe field applied to a transistor may be deformed or blocked so that variation of characteristics of the transistor may be prevented or reduced. Thus, reliability of a display device including the transistor may be improved.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

Display devices according to embodiments of the present inventive concept will be described in more detail hereinafter with reference to the accompanying drawings, in which some embodiments are shown.

Figure 1:
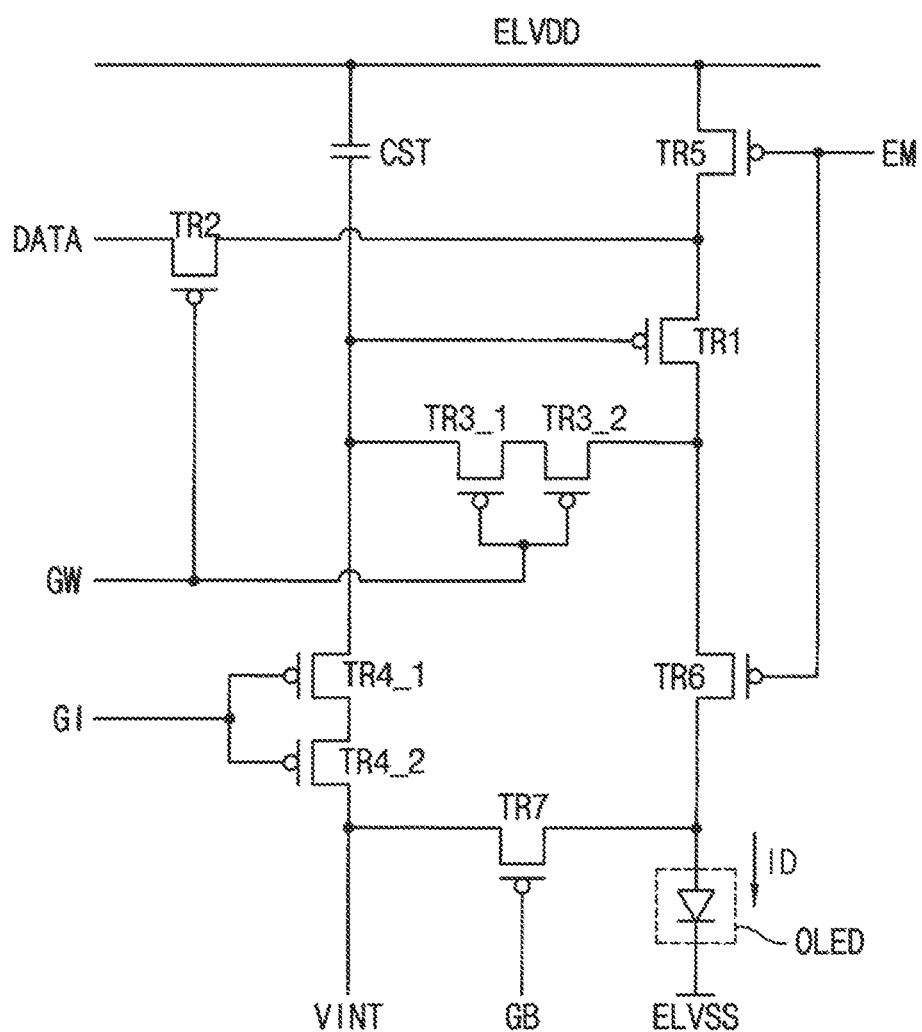
FIG. 1 is a circuit diagram of a pixel unit of a display device according to embodiments.
Figure 2:
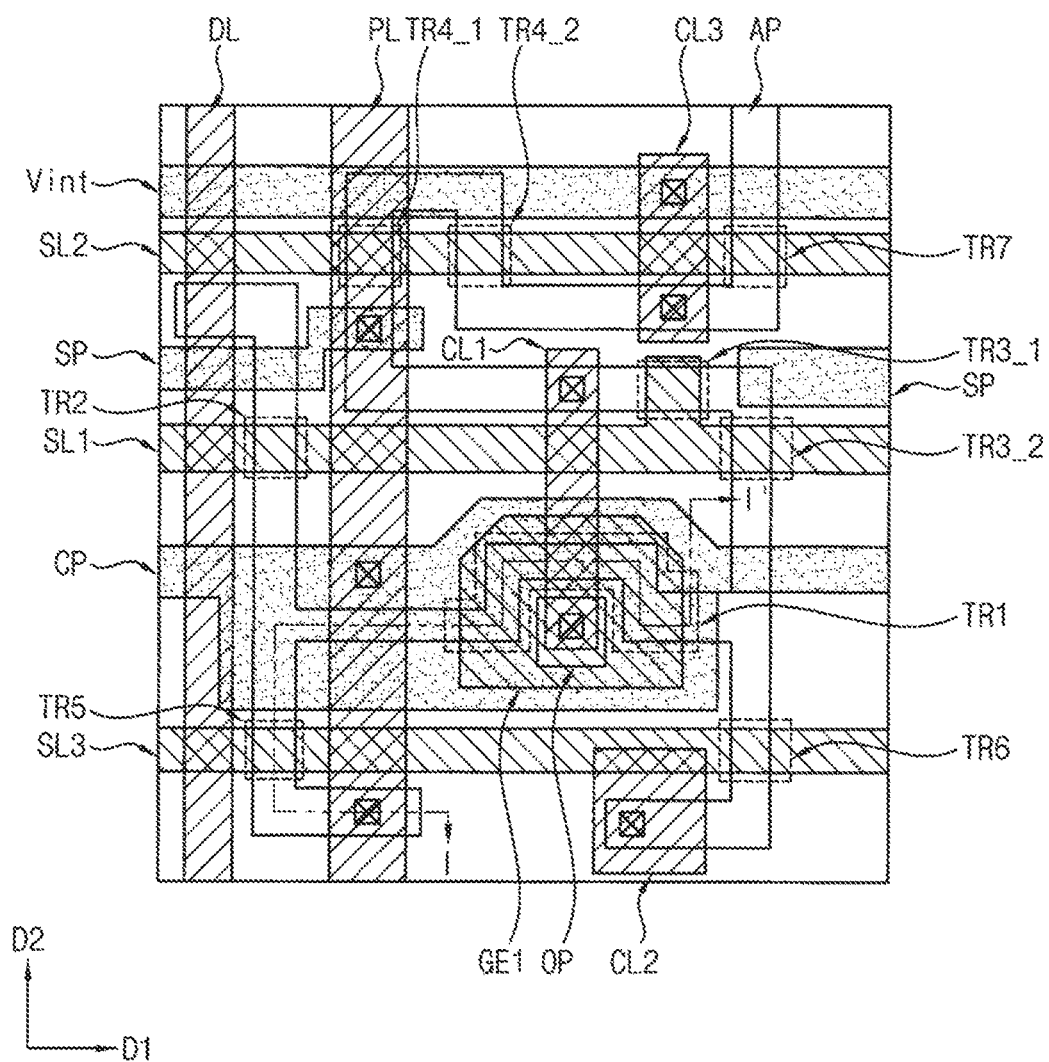
FIG. 2 is a plan view driving elements of the pixel unit of a display device according to embodiments.

FIG. 1 is a circuit diagram of a pixel unit of a display device according to embodiments. FIG. 2 is a plan view driving elements of the pixel unit of a display device according to embodiments.

A display device according to embodiments includes an array of pixels to display an image in response to a driving signal. Each pixel units may include a light-emitting element and a pixel circuit, which drives the light-emitting element. The pixel circuit may include a plurality of driving elements.

For example, referring to FIGS. 1 and 2, the pixel circuit may include first to seventh transistors TR1, TR2, TR3_1, TR3_2, TR4_1, TR4_2, TR5, TR6, and TR7, storage capacitor CST, a high power voltage ELVDD wiring, a low power voltage ELVSS wiring, an initialization voltage VINT wiring, a data signal DATA wiring, a scan signal GW wiring, a data initialization signal GI wiring, an emission control signal EM wiring, a diode initialization signal GB wiring, and the like.

An organic light emitting diode OLED may output a light based on a driving current ID. The organic light emitting diode OLED may include a first terminal and a second terminal. According to embodiments, the second terminal of the organic light emitting diode OLED may be supplied with the low power voltage ELVSS. For example, the first terminal of the organic light emitting diode OLED may be an anode terminal, and the second terminal of the organic light emitting diode OLED may be a cathode terminal. Alternatively, the first terminal of the organic light emitting diode OLED may be a cathode terminal, and the second terminal of the organic light emitting diode OLED may be an anode terminal.

The first transistor TR1 may include a gate terminal, a first terminal, and a second terminal. According to embodiments, the first terminal of the first transistor TR1 may be a source terminal, and the second terminal of the first transistor TR1 may be a drain terminal. Alternatively, the first terminal of the first transistor TR1 may be a drain terminal, and the second terminal of the first transistor TR1 may be a source terminal.

The first transistor TR1 may generate a driving current ID. According to embodiments, the first transistor TR1 may operate in a saturation area. In this case, the first transistor TR1 may generate the driving current ID based on a voltage difference between the gate terminal and the source terminal. In addition, a gray scale may be expressed based on a size of the driving current ID supplied to the organic light emitting diode OLED. Alternatively, the first transistor TR1 may operate in a linear area. In this case, a gray scale may be expressed based on the sum of times for supplying the driving current to the organic light emitting diode within one frame.

The second transistor TR2 may include a gate terminal, a first terminal, and a second terminal. The gate terminal of the second transistor TR2 may be supplied with the scan signal GW. The first terminal of the second transistor TR2 may be supplied with the data signal DATA. The second terminal of the second transistor TR2 may be connected to the first terminal of the first transistor TR1. According to embodiments, the first terminal of the second transistor TR2 may be a source terminal, and the second terminal of the second transistor TR2 may be a drain terminal. Alternatively, the first terminal of the second transistor TR2 may be a drain terminal, and the second terminal of the second transistor TR2 may be a source terminal.

The second transistor TR2 may supply the data signal DATA to the first terminal of the first transistor TR1 during an activation period of the scan signal GW. In this case, the second transistor TR2 may operate in a linear area.

Each of the third transistors TR3_1 and TR3_2 may include a gate terminal, a first terminal, and a second terminal. The third transistor TR3_1 and the third transistor TR3_2 may be connected in series and may be operated as a dual transistor. For example, when the dual transistor is turned off, a leakage current may be reduced. The gate terminal of each of the third transistors TR3_1 and TR3_2 may be supplied with the scan signal GW. The first terminal of each of the third transistors TR3_1 and TR3_2 may be connected to the gate terminal of the first transistor TR1. The second terminal of each of the third transistors TR3_1 and TR3_2 may be connected to the second terminal of the first transistor TR1. According to embodiments, the first terminal of each of the third transistors TR3_1 and TR3_2 may be a source terminal, and the second terminal of each of the third transistors TR3_1 and TR3_2 may be a drain terminal. Alternatively, the first terminal of each of the third transistors TR3_1 and TR3_2 may be a drain terminal, and the second terminal of the third transistors TR3_1 and TR3_2 may be a source terminal.

Each of the third transistors TR3_1 and TR3_2 may connect the gate terminal of the first transistor TR1 to the second terminal of the first transistor TR1 during an activation period of the scan signal GW. In this case, each of the third transistors TR3_1 and TR3_2 may operate in a linear area. In other words, each of the third transistors TR3_1 and TR3_2 may diode-connect the first transistor TR1 during an activation period of the scan signal GW. Because the first transistor TR1 is diode-connected, a voltage difference equal to a threshold voltage of the first transistor TR1 may occur between the first terminal of the first transistor TR1 and the gate terminal of the first transistor TR1. As a result, a voltage obtained by adding the voltage difference (that is, the threshold voltage) to a voltage of the data signal DATA supplied to the first terminal of the first transistor TR1 may be supplied to the gate terminal of the first transistor TR1 during the activation period of the scan signal GW. In other words, the data signal DATA may be compensated as much as the threshold voltage of the first transistor TR1, and the compensated data signal DATA may be supplied to the gate terminal of the first transistor TR1.

An input terminal of the initialization voltage VINT may be connected to a first terminal of each of the fourth transistors TR4_1 and TR4_2 and a first terminal of the seventh transistor TR7, and an output terminal of the initialization voltage VINT may be connected to a second terminal of each of the fourth transistors TR4_1 and TR4_2 and a first terminal of the storage capacitor CST.

Each of the fourth transistors TR4_1 and TR4_2 may include a gate terminal, a first terminal, and a second terminal. The fourth transistor TR4_1 and the fourth transistor TR4_2 may be connected in series and may be operated as a dual transistor. For example, when the dual transistor is turned off, a leakage current may be reduced. The gate terminal of each of the fourth transistors TR4_1 and TR4_2 may receive the data initialization signal GI. The first terminal of each of the fourth transistors TR4_1 and TR4_2 may be supplied with the initialization voltage VINT. The second terminal of each of the fourth transistors TR4_1 and TR4_2 may be connected to the gate terminal of the first transistor TR1. According to embodiments, the first terminal of each of the fourth transistors TR4_1 and TR4_2 may be a source terminal, and the second terminal of each of the fourth transistors TR4_1 and TR4_2 may be a drain terminal. Alternatively, the first terminal of each of the fourth transistors TR4_1 and TR4_2 may be a drain terminal, and the second terminal of each of the fourth transistors TR4_1 and TR4_2 may be a source terminal.

Each of the fourth transistors TR4_1 and TR4_2 may supply the initialization voltage VINT to the gate terminal of the first transistor TR1 during the activation period of the data initialization signal GI. In this case, each of the fourth transistors TR4_1 and TR4_2 may operate in a linear area. In other words, each of the fourth transistors TR4_1 and TR4_2 may initialize the gate terminal of the first transistor TR1 into the initialization voltage VINT during the activation period of the data initialization signal GI. According to embodiments, the initialization voltage VINT may have a voltage level sufficiently lower than a voltage level of the data signal DATA maintained by the storage capacitor CST in a previous frame, and the initialization voltage VINT may be supplied to a gate terminal of a first transistor TR1 which is a p-channel metal oxide semiconductor (PMOS) transistor. According to embodiments, the initialization voltage may have a voltage level sufficiently higher than the voltage level of the data signal maintained by the storage capacitor in the previous frame, and the initialization voltage may be supplied to a gate terminal of a first transistor which is an n-channel metal oxide semiconductor (NMOS) transistor.

According to embodiments, the data initialization signal GI may be the same (or substantially the same) signal as the scan signal GW before one horizontal time. For example, the data initialization signal GI supplied to a sub-pixel of the nth row (where n is an integer of 2 or more) among a plurality of sub-pixels (e.g., a pixel circuit PIXEL CIRCUIT) and organic light emitting diode OLED included in the organic light emitting display device 100 may be the same (or substantially the same) signal as the scan signal GW supplied to a sub-pixel of the (n−1)th row among the sub-pixels. In other words, an activated scan signal GW is supplied to the sub-pixel of the (n−1)th row among the sub-pixels, so that an activated data initialization signal GI may be supplied to the sub-pixel of the nth row among the sub-pixels. As a result, the data signal DATA may be supplied to the sub-pixel of the (n−1)th row among the sub-pixels, and the gate terminal of the first transistor TR1 included in the sub-pixel of the nth row among the sub-pixels may be initialized to the initialization voltage VINT.

The fifth transistor TR5 may include a gate terminal, a first terminal, and a second terminal. The gate terminal may be supplied with the emission control signal EM. The first terminal may be connected to the high power voltage ELVDD wiring. The second terminal may be connected to the first terminal of the first transistor TR1. According to embodiments, the first terminal of the fifth transistor TR5 may be a source terminal, and the second terminal of the fifth transistor TR5 may be a drain terminal. Alternatively, the first terminal of the fifth transistor TR5 may be a drain terminal, and the second terminal of the fifth transistor TR5 may be a source terminal.

The fifth transistor TR5 may supply the high power voltage ELVDD to the first terminal of the first transistor TR1 during the activation period of the emission control signal EM. On the contrary the fifth transistor TR5 may block the supply of the high power voltage ELVDD during the inactivation period of the emission control signal EM. In this case, the fifth transistor TR5 may operate in a linear area. The fifth transistor TR5 may supply the high power voltage ELVDD to the first terminal of the first transistor TR1 during the activation period of the emission control signal EM, so that the first transistor TR1 may generate the driving current ID. In addition, the fifth transistor TR5 may block the supply of the high power voltage ELVDD during the inactivation period of the emission control signal EM, so that the data signal DATA supplied to the first terminal of the first transistor TR1 may be supplied to the gate terminal of the first transistor TR1.

The sixth transistor TR6 may include a gate terminal, a first terminal, and a second terminal. The gate terminal may be supplied with the emission control signal EM. The first terminal may be connected to the second terminal of the first transistor TR1. The second terminal may be connected to the first terminal of the organic light emitting diode OLED. According to embodiments, the first terminal may be a source terminal, and the second terminal may be a drain terminal. Alternatively, the first terminal may be a drain terminal, and the second terminal may be a source terminal.

The sixth transistor TR6 may supply the driving current ID generated by the first transistor TR1 to the organic light emitting diode OLED during the activation period of the emission control signal EM. In this case, the sixth transistor TR6 may operate in a linear area. In other words, the sixth transistor TR6 may supply the driving current ID generated by the first transistor TR1 to the organic light emitting diode OLED during the activation period of the emission control signal EM, so that the organic light emitting diode OLED may output light. In addition, the sixth transistor TR6 electrically isolates the first transistor TR1 and the organic light emitting diode OLED from each other during the inactivation period of the emission control signal EM, so that the data signal DATA supplied to the second terminal of the first transistor TR1 (more precisely, the data signal compensated for the threshold voltage) may be supplied to the gate terminal of the first transistor TR1.

The seventh transistor TR7 may include a gate terminal, a first terminal, and a second terminal. The gate terminal may be supplied with the diode initialization signal GB. The first terminal may be supplied with the initialization voltage VINT. The second terminal may be connected to the first terminal of the organic light emitting diode OLED. According to embodiments, the first terminal may be a source terminal, and the second terminal may be a drain terminal.

Alternatively, the first terminal may be a drain terminal, and the second terminal may be a source terminal.

The seventh transistor TR7 may supply the initialization voltage VINT to the first terminal of the organic light emitting diode OLED during the activation period of the diode initialization signal GB. In this case, the seventh transistor TR7 may operate in a linear area. In other words, the seventh transistor TR7 may initialize the first terminal of the organic light emitting diode OLED into the initialization voltage VINT during activation period of the diode initialization signal GB.

Alternatively, the data initialization signal GI may be the same (or substantially the same) as the diode initialization signal GB. An operation of initializing the gate terminal of the first transistor TR1 and an operation of initializing the first terminal of the organic light emitting diode OLED may not affect each other. In other words, the operation of initializing the gate terminal of the first transistor TR1 and the operation of initializing the first terminal of the organic light emitting diode OLED may be independent of each other. Accordingly, the diode initialization signal GB is not separately generated.

The storage capacitor CST may include a first terminal and a second terminal. The storage capacitor CST may be connected between the high power voltage ELVDD wiring and the gate terminal of the first transistor TR1. For example, the first terminal of the storage capacitor CST may be connected to the gate terminal of the first transistor TR1, and the second terminal of the storage capacitor CST may be connected to the high power voltage ELVDD wiring. The storage capacitor CST may maintain a voltage level of the gate terminal of the first transistor TR1 during the inactivation period of the scan signal GW. The inactivation period of the scan signal GW may include an activation period of the emission control signal EM, and the driving current ID generated by the first transistor TR1 during the activation period of the emission control signal EM may be supplied to the organic light emitting diode OLED. Accordingly, the driving current ID generated by the first transistor TR1 may be supplied to the organic light emitting diode OLED, based on the voltage level maintained by the storage capacitor CST.

Embodiments are not limited to the above pixel configuration illustrated in FIG. 1. The number of transistors in a pixel unit and a combination of the transistors may be variously changed.

Referring to FIGS. 1 and 2, a pixel unit of a display device according to embodiments may include an active pattern AP, a first gate electrode GE1, a first scan line SL1, a second scan line SL2, a third scan line SL3, a capacitor electrode pattern CP, a shielding pattern SP, an initialization voltage wiring Vint, a data line DL and a power wiring PL.

The first scan line SL1 may transfer the scan signal GW illustrated in FIG. 1. A portion of the active pattern AP, which overlaps the first scan line SL1, may correspond to channels of the second transistor TR2 and the third transistors TR3_1 and TR3_2.

The second scan line SL2 may transfer the data initialization signal GI illustrated in FIG. 1. A portion of the active pattern AP, which overlaps the second scan line SL2, may correspond to channels of the fourth transistors TR4_1 and TR4_2 and the seventh transistor TR7.

The third scan line SL3 may transfer the emission control signal EM illustrated in FIG. 1. A portion of the active pattern AP, which overlaps the third scan line SL3, may correspond to channels of the fifth transistors TR5 and the sixth transistor TR6.

A portion of the active pattern AP, which overlaps the first gate electrode GE1, may correspond to a channel of the first transistor TR1. The first gate electrode GE1 may be electrically connected to a portion of the active pattern AP, which corresponds to an output terminal of the fourth transistors TR4_1 and TR4_2, through a first connection wiring CL1.

For example, the first to third scan lines SL1, SL2 and SL3 may extend in a first direction D1.

According to embodiments, the first gate electrode GE1 and the first to third scan lines SL1, SL2 and SL3 may be formed in a same layer. For example, the first gate electrode GE1 and the first to third scan lines SL1, SL2 and SL3 may be referred to as a first gate metal pattern. However, embodiments are not limited thereto. For example, at least one of the first gate electrode GE1 or the first to third scan lines SL1, SL2 or SL3 may be formed or located in a different layer from others.

The capacitor electrode pattern CP may be electrically connected to the power wiring PL to receive the high power voltage ELVDD. The capacitor electrode pattern CP may overlap the first gate electrode GE1 to form the storage capacitor CST. The capacitor electrode pattern CP may be formed or located on the first gate electrode GE1 and may include an opening OP overlapping the first gate electrode GE1. The first connection wiring CL1 may electrically contact the first gate electrode GE1 through the opening OP.

According to embodiments, the opening OP may not overlap the channel of the first transistor TR1 in a plan view. For example, the opening OP may be spaced apart from the active pattern AP in a plan view.

The shielding pattern SP may overlap the active pattern AP between the channels of the third transistors TR3_1 and TR3_2. The shielding pattern SP may be electrically connected to the power wiring PL to receive the high power voltage ELVDD.

The initialization voltage wiring Vint may transfer the initialization voltage VINT illustrated in FIG. 1.

According to embodiments, the capacitor electrode pattern CP, the shielding pattern SP and the initialization voltage wiring Vint may be formed or located in a same layer. For example, the capacitor electrode pattern CP, the shielding pattern SP and the initialization voltage wiring Vint may be referred to as a second gate metal pattern. However, embodiments according to the present disclosure are not limited thereto. For example, at least one of the capacitor electrode pattern CP, the shielding pattern SP, or the initialization voltage wiring Vint may be formed in a different layer from others.

The data line DL may transfer the data signal DATA illustrated in FIG. 1. The data line DL may be electrically connected to the active pattern AP to transfer the data signal DATA to the second transistor TR2.

The power wiring PL may transfer the high power voltage ELVDD illustrated in FIG. 1. The power wiring PL may be electrically connected to the active pattern AP to transfer the high power voltage ELVDD to the fifth transistor TR5.

For example, the data line DL and the power wiring PL may extend in a second direction D2 crossing the first direction D1.

According to embodiments, the first connection wiring CL1, the data line DL and the power wiring PL may be formed in a same layer. For example, the first connection wiring CL1, the data line DL and the power wiring PL may be referred to as a first source metal pattern. The first source metal pattern may further include a second connection wiring CL2 and a third connection wiring CL3. The second connection wiring CL2 may electrically connect the sixth transistor TR6 to the organic light-emitting diode OLED. The third connection wiring CL3 may electrically connect the initialization voltage wiring Vint to the active pattern AP. However, embodiments according to the present disclosure are not limited thereto. For example, at least one of the first to third connection wirings CL1, CL2 or CL3, the data line DL, or the power wiring PL may be located in a different layer from others.

A pixel unit of a display device according to embodiments may further include another active layer and/or another metal layer in addition to the active pattern AP, the first gate metal pattern, the second gate metal pattern and the first source metal pattern.

Figure 3:
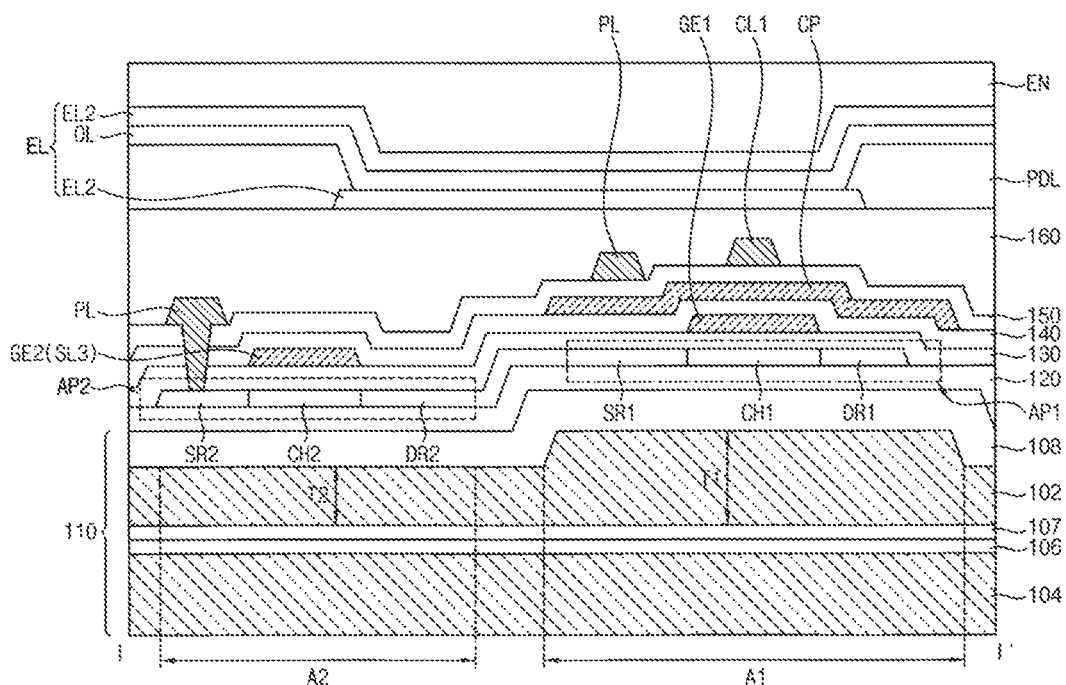
FIG. 3 is a cross-sectional view illustrating a driving element and a light-emitting element of a display device according to embodiments.

FIG. 3 is a cross-sectional view illustrating driving elements and a light-emitting element of a display device according to embodiments. FIG. 3 may partially illustrate driving elements. For example, FIG. 3 may show a driving transistor and a switching transistor. For example, the driving transistor and the switching transistor may correspond to the first transistor TR1 and the fifth transistor TR5 of the pixel unit, which are illustrated in FIGS. 1 and 2.

A buffer layer 120 may be located on the base substrate 110. An active pattern may be located on the buffer layer 120.

For example, the base substrate 110 may include glass, quartz, sapphire, a polymeric material or the like. According to embodiments, the base substrate 110 may include a transparent rigid material such as glass.

The buffer layer 120 may prevent or reduce permeation of impurities, humidity or external gas from underneath of the base substrate 110, and may reduce a roughness of an upper surface of the base substrate 110. For example, the buffer layer 120 may include an inorganic material such as silicon oxide, silicon nitride or the like. For example, the buffer layer 120 may include a lower layer including silicon nitride and an upper layer including a silicon oxide. According to embodiments, the base substrate 110 may include a plurality of areas having different heights of an upper surface. Thus, an upper surface of the buffer layer 120 may have different heights depending on the different heights of the base substrate 110.

The active pattern may include a channel region, a source region and a drain region. For example, the active pattern may include channel regions CH1 and CH2, source regions SR1 and SR2 electrically connected to the channel regions CH1 and CH2, and drain regions DR1 and DR2 electrically connected to the channel regions CH1 and CH2. The source regions SR1 and SR2 and the drain regions DR1 and DR2 may function as source terminals and drain terminals, respectively.

According to embodiments, the active pattern may include a first active region AP1 and a second active region AP2. The first active region AP1 may include a first channel region CH1, a first source region SR1 and a first drain region DR1. The second active region AP2 may include a second channel region CH2, a second source region SR2 and a second drain region DR2. For example, the first active region AP1 and the second active region AP2 may be formed in a same pattern to be continuously connected to each other. For example, the first source region SR1 of the first active region AP1 may be connected to the second drain region DR2 of the second active region AP2. However, embodiments according to the present disclosure are not limited thereto. For example, the first active region AP1 and the second active region AP2 may be defined by different patterns spaced apart from each other.

According to embodiments, the upper surfaces of the base substrate 110 and the buffer layer 120 may have height variation. Thus, the active regions on the buffer layers 120 may be located at different heights. According to embodiments, the first channel region CH1 or the first active region AP1 including the first channel region CH1 may be arranged to be higher than the second channel region CH2 or the second active region AP2 including the second channel region CH2.

A first gate metal pattern may be located on the active pattern. For example, the first gate metal pattern may include a first gate electrode GE1 overlapping the first channel region CH1 and a second gate electrode GE2 overlapping the second channel region CH2. A first insulation layer 130 may be located between the active pattern and the first gate metal pattern.

The active pattern and the gate electrodes may define a plurality of transistors. For example, the first transistor TR1 illustrated in FIGS. 1 and 2 may be defined by the first gate electrode GE1 and the first active region AP1. The fifth transistor TR5 illustrated in FIGS. 1 and 2 may be defined by the second gate electrode GE2 and the second active region AP2. The first transistor TR1 may be a driving transistor providing a driving current to the organic light-emitting diode OLED. The fifth transistor TR5 may be a switching transistor receiving the emission control signal EM. The second gate electrode GE2 may be defined by a portion of the third scan line SL3 transferring the emission control signal EM.

However, embodiments according to the present disclosure are not limited thereto. For example, at least one of the second transistor TR2, the third transistors TR3_1 or TR3_2, the fourth transistor TR4_1 or TR4_2, the sixth transistor TR6 or the seventh transistor TR7 may be defined by the second gate electrode GE2 and the second active region AP2.

A second gate metal pattern including the capacitor electrode pattern CP may be located on the first gate metal pattern. For example, the capacitor electrode pattern CP may overlap the first gate electrode GE1.

A second insulation layer 140 may be located between the first gate metal pattern and the second gate metal pattern. A third insulation layer 150 may be located on the second gate metal pattern.

For example, the active pattern may include silicon or a metal oxide semiconductor. According to embodiments, the active pattern may include polycrystalline silicon (polysilicon), which may be doped with n-type impurities or p-type impurities.

According to embodiments, an active pattern may include a metal oxide semiconductor. For example, the active pattern may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may each include silicon oxide, silicon nitride, silicon oxynitride or a combination thereof. Furthermore, the first insulation layer 130, the second insulation layer 140 and the third insulation layer 150 may each include an insulating metal oxide such as aluminum oxide, tantalum oxide, hafnium oxide, zirconium oxide, titanium oxide or the like. For example, the first insulation layer 130, the second insulation layer 140 and the third insulation layer 150 may each have a single-layered structure or a multi-layered structure, which includes silicon nitride and/or silicon oxide.

For example, the first and second gate metal patterns may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may each have a single-layered structure or a multi-layered structure including different metal layers.

A first source metal pattern may be located on the third insulation layer 150. The first source metal pattern may include the power wiring PL, which passes through an insulation layer thereunder to electrically contact the active pattern. For example, the power wiring PL may electrically contact the second source region SR2. The first source metal pattern may further include at least one connection wirings, which includes the first connection wiring CL1 electrically connecting the first gate electrode GE1 and the active pattern.

For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. According to embodiments, the first source metal pattern may have a multi-layered structure including aluminum.

A fourth insulation layer 160 may be located on the first source metal pattern. The fourth insulation layer 160 may cover a structure thereunder to planarize the substrate. The fourth insulation layer 160 may include an organic material. For example, the fourth insulation layer 160 may include an organic insulation material such as a phenol resin, an acryl resin, a polyimide resin, a polyamide resin, a siloxane resin, an epoxy resin or the like. The fourth insulation layer 160 may be referred to as a via insulation layer or an organic insulation layer.

A light-emitting element EL may be located on the fourth insulation layer 160. The light-emitting element EL may include a first electrode EL1, an organic layer OL located on the first electrode EL1 and a second electrode EL2 located on the organic layer OL. The light-emitting element EL may be electrically connected to a transistor. For example, the light-emitting element EL may be electrically connected to the drain terminal of the sixth transistor TR6.

A pixel-defining layer PDL may be located on the fourth insulation layer 160. The pixel-defining layer PDL may include an opening overlapping at least a portion of the first electrode EL1. At least a portion of the organic layer OL may be located in the opening of the pixel-defining layer PDL. According to embodiments, the organic layer OL may include a common layer continuously extending over a plurality of pixel areas, or may have a pattern shape located within a pixel area. The pixel-defining layer PDL may include an organic material.

The first electrode EL1 may function as an anode. For example, the first electrode EL1 may be formed as a transmissive electrode or a reflective electrode according to an emission type of the display device. When the first electrode EL1 is a transmissive electrode, the first electrode EL1 may include indium tin oxide, indium zinc oxide, zinc tin oxide, indium oxide, zinc oxide, tin oxide or the like. When the first electrode EL1 is a reflective electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmissive electrode.

The organic layer OL may include at least an emission layer, and may further include at least one of a hole injection layer (HIL), a hole transporting layer (HTL), an electron transporting layer (ETL), or an electron injection layer (EIL). For example, the organic layer OL may include a low molecular weight organic compound or a high molecular weight organic compound.

According to embodiments, the organic layer OL may emit a red light, a green light or a blue light. According to embodiments, the organic layer OL may emit a white light. The organic layer OL emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode EL2 may function as a cathode. The second electrode EL2 may be formed as a transmissive electrode or a reflective electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over a plurality of the pixel areas.

An encapsulation layer EN may be located on the second electrode EL2. The encapsulation layer EN may have a stacked structure of an inorganic thin film and an organic thin film. For example, the encapsulation layer EN may include a first inorganic thin film, an organic thin film located on the inorganic thin film and a second inorganic thin film located on the organic thin film.

For example, the organic thin film may include a cured polymer resin such as poly(meth)acrylate or the like. For example, the cured polymer resin may be formed by cross-linking reaction of monomers. For example, the inorganic thin films may include silicon oxide, silicon nitride, silicon oxynitride, aluminum oxide, tantalum oxide, hafnium oxide, zirconium oxide, titanium oxide or a combination thereof.

The base substrate 110 includes at least one polymeric film. For example, the base substrate 110 may include an upper polymeric film 102, a lower polymeric film 104 located under the upper polymeric film 102, a lower barrier layer 106 located between the upper polymeric film 102 and the lower polymeric film 104, an upper barrier layer 108 located between the upper polymeric film 102 and the active pattern, and an adhesion-enhancing layer 107 located between the upper polymeric film 102 and the lower barrier layer 106.

For example, the upper polymeric film 102 may be referred to as a first polymeric film, and the lower polymeric film 104 may be referred to as a second polymeric film. The upper barrier layer 108 may be referred to as a first barrier layer, and the lower barrier layer 106 may be referred to as a first barrier layer. Herein, the terms such as "first", "second" and the like are used for distinguishing elements, and are not used for referring to a specific element.

The upper polymeric film 102 and the lower polymeric film 104 may each include a polymeric material. For example, the upper polymeric film 102 and the lower polymeric film 104 may each include polyethylene terephthalate, polyethylene naphthalate, polyether ketone, polycarbonate, polyarylate, polyether sulfone, polyimide, polybenzoxazole, polybenzobisoxazole, polybenzoimidazole, polybenzothiazole or a combination thereof. According to embodiments, the upper polymeric film 102 and the lower polymeric film 104 may each include polyimide.

The lower barrier layer 106 and the upper barrier layer 108 may each include an inorganic material. For example, the lower barrier layer 106 and the upper barrier layer 108 may each include silicon oxide, silicon nitride, silicon oxynitride, aluminum oxide, tantalum oxide, hafnium oxide, zirconium oxide, titanium oxide or a combination thereof. For example, the lower barrier layer 106 and the upper barrier layer 108 may each include silicon oxide.

The adhesion-enhancing layer 107 may increase adhesion of the upper polymeric film 102 and the lower barrier layer 106. For example, the adhesion-enhancing layer 107 may amorphous silicon.

According to embodiments, the upper polymeric film 102 may have thickness variation. For example, a first thickness T1 of a first area A1 overlapping the first channel region CH1 may be greater than a thickness of other area. For example, the first thickness T1 of the first area A1 may be greater than a second thickness T2 of a second area A2 overlapping the second channel region CH2. According to embodiments, the second area A2 is not limited to the area overlapping the second channel region CH2. For example, the second area A2 may include a peripheral area adjacent to the first area A1 or an area overlapping channels of other transistors.

According to embodiments, the lower polymeric film 104 may have a uniform thickness.

Figure 4:
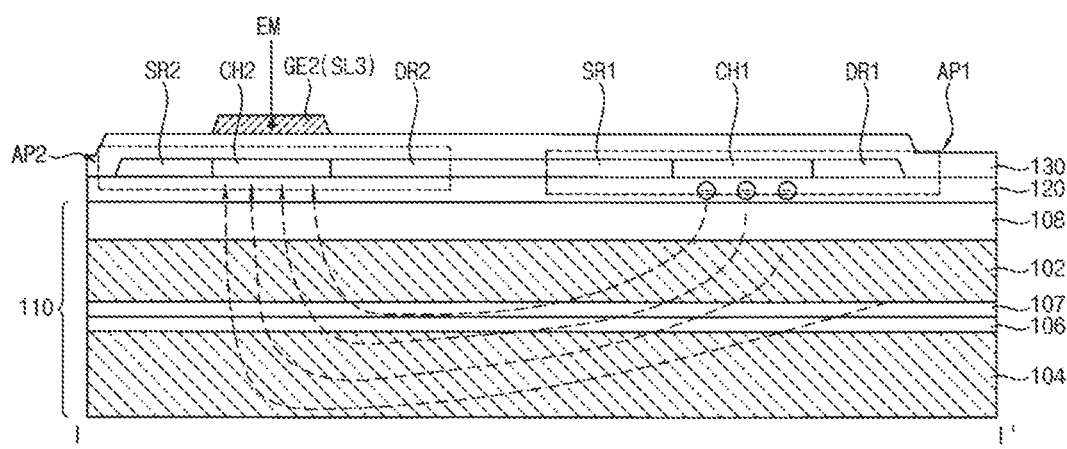
FIGS. 4 and 5 are cross-sectional views for explaining effects of a display device according to embodiments.
Figure 5:
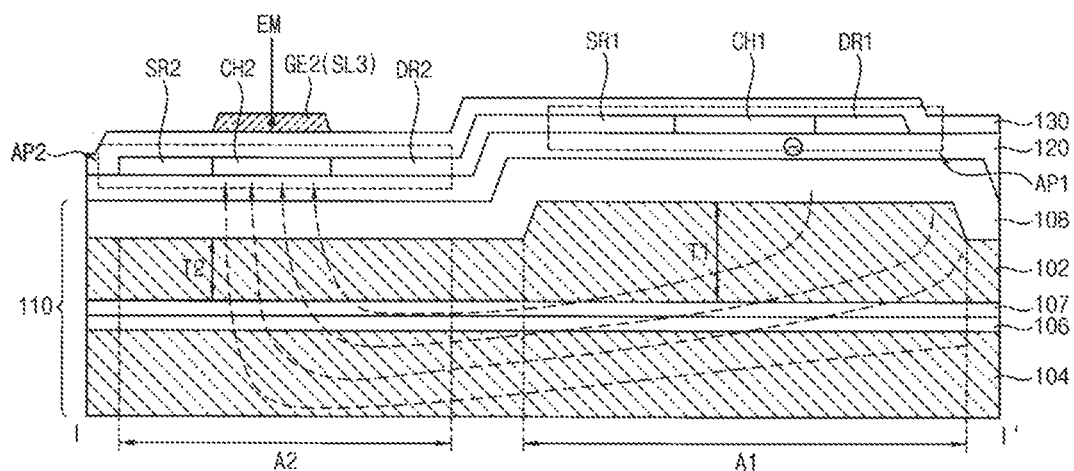

For example, referring to FIGS. 4 and 5, a gate voltage applied to the second gate electrode GE2 located on the second channel region CH2 may function as a bias voltage. For example, a fringe field (illustrated by arrows in FIGS. 4 and 5) may be formed between the first active region AP1 and the second active region AP2 by dipole polarization of the upper polymeric film 102 and the bias voltage. For example, when the second active region AP2 defines the fifth transistor TR5, a fringe field may be formed by the emission control signal EM applied to the second gate electrode GE2.

Referring to FIG. 5, when a thickness of the upper polymeric film 102 is increased under the first channel region CH1, permittivity is changed. As a result, a direction of a fringe field may be inclined to get closer to a horizontal direction under the first channel region CH1, with compared to the structure illustrated in FIG. 4, wherein an upper polymeric film 102 has a uniform thickness. Furthermore, because the first channel region CH1 is arranged to be higher than the second channel region CH2, influence to the first channel region CH1 by the fringe field may be reduced. Thus, electric charges accumulated at a lower interface of the first channel region CH1 by the fringe field may be reduced. Thus, variation of a driving voltage may be reduced thereby improving reliability of a display device. For example, according to embodiments, image sticking figure of merit (ISFOM), which relates to a middle/long term after-image of a display device, may be improved.

According to embodiments, a ratio of the first thickness T1 to the second thickness T2 in the upper polymeric film 102 may be at least 1.2 to achieve a sufficient effect for changing a fringe field. For example, a ratio of the first thickness T1 to the second thickness T2 in the upper polymeric film 102 may be 1.2 to 1.5. When a ratio of the first thickness T1 to the second thickness T2 is less than 1.2, the effect may be small. When a ratio of the first thickness T1 to the second thickness T2 is more than 1.5, disconnection of patterns formed on the base substrate 110 may be caused by a height difference, or an additional process may be required to compensate for the height difference. For example, a difference between the first thickness T1 and the second thickness T2 may be 5,000 Å to 20,000 Å.

Figure 6:
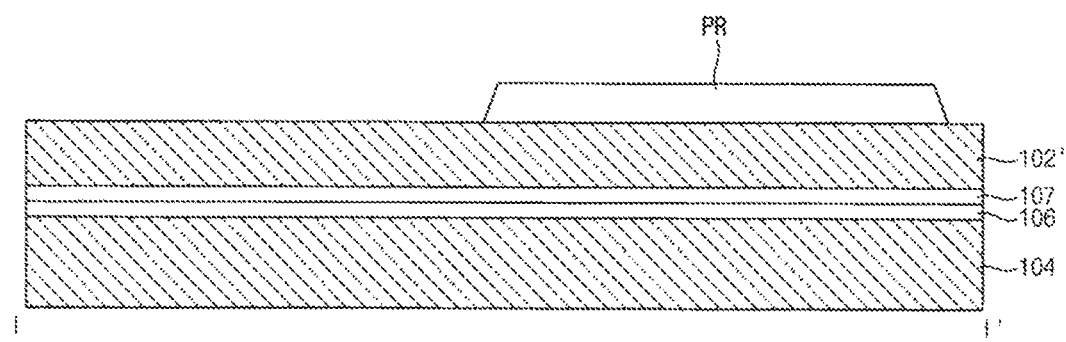
FIGS. 6, 7 and 8 are cross-sectional views illustrating a method for manufacturing a base substrate of a display device according to embodiments.
Figure 7:
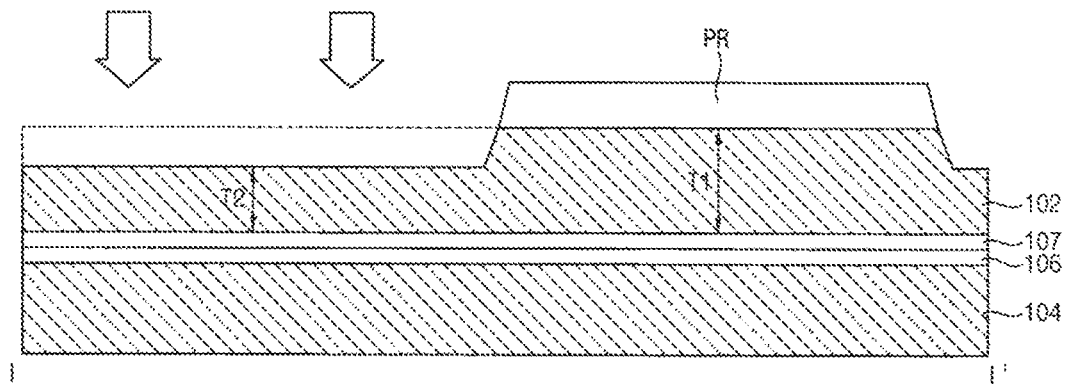
Figure 8:
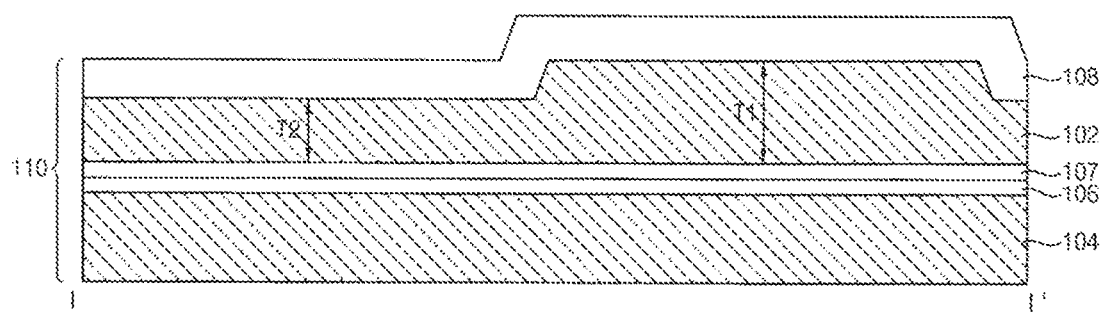

FIGS. 6 to 8 are cross-sectional views illustrating a method for manufacturing a base substrate of a display device according to embodiments.

Referring to FIG. 6, a lower barrier layer 106 is formed on a lower polymeric film 104. An adhesion-enhancing layer 107 is formed on the lower barrier layer 106. A polymeric common layer 102' is formed on the adhesion-enhancing layer 107.

The lower polymeric film 104 may be formed on a carrier substrate. For example, the carrier substrate may include a rigid material such as glass. The carrier substrate may be removed after a pixel structure is formed.

For example, a composition including a polymer or a polymer precursor may be coated on the carrier substrate, and then dried and/or cured to font the lower polymeric film 104. According to embodiments, the composition may include polyimide or polyimide precursor such as polyamic acid. The polymeric common layer 102' may be formed on the adhesion-enhancing layer 107 through similar processes to those for forming the lower polymeric film 104.

A mask PR may be formed on a first area A1 of the polymeric common layer 102'. For example, the mask PR may be formed from a photoresist composition.

Referring to FIG. 7, an exposed portion of the polymeric common layer 102' is partially etched to reduce a thickness of the exposed portion. For example, the exposed portion of the polymeric common layer 102' may be dry-etched.

Because the first area A1 is covered by the mask PR, a thickness of the first area A1 may be maintained. As a result, the upper polymeric film 102 may have a first thickness T1 in the first area A1 and a second thickness T2, which is smaller than the first thickness T1, in a remaining area.

Referring to FIG. 8, an upper barrier layer 108 is formed on the upper polymeric film 102 to form a base substrate 110. For example, the lower barrier layer 106 may include an inorganic material such as silicon oxide. As the upper polymeric film 102 has a thickness variation, an upper surface of the upper polymeric film 102 may have a height variation. Thus, an upper surface of the upper barrier layer 108 and an upper surface of the base substrate 110 may have a height variation.

A driving element, a light-emitting element and an encapsulation layer may be formed on the base substrate 110, as illustrated in FIG. 3.

Figure 9:
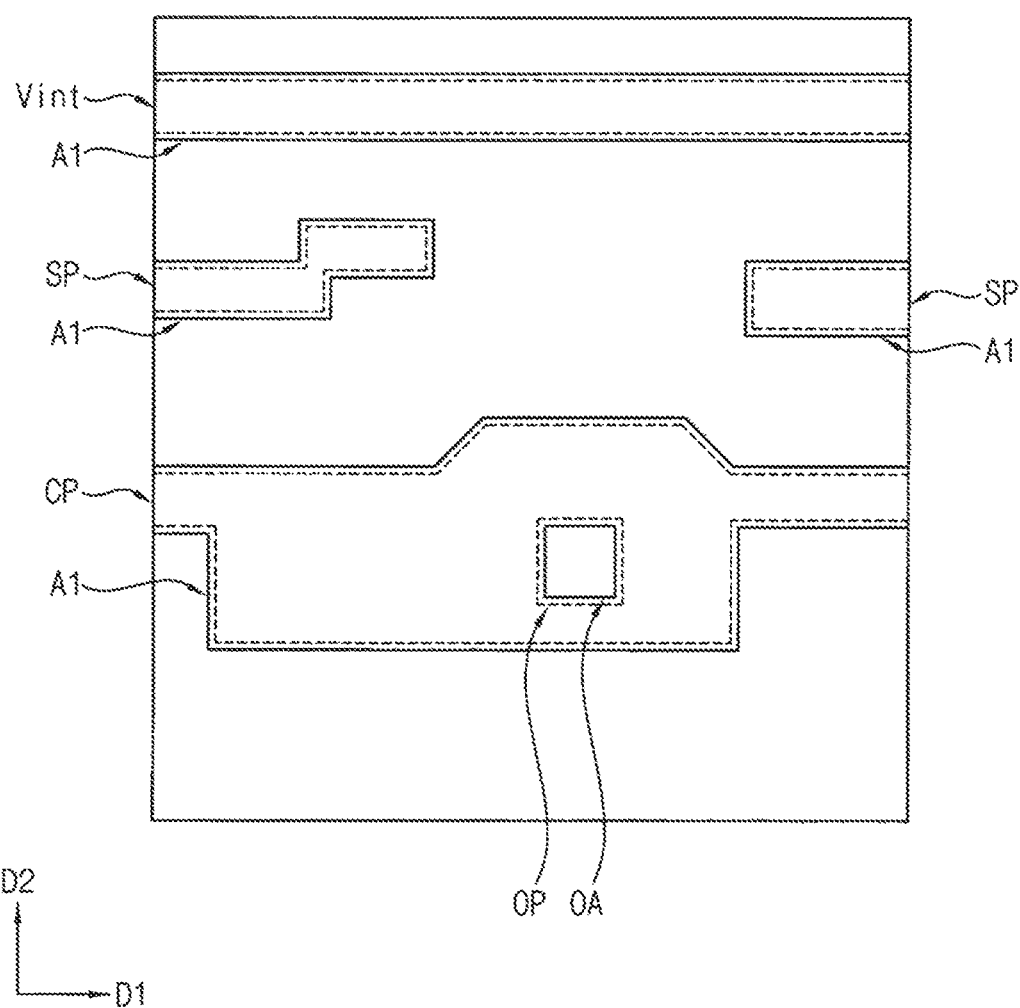
FIG. 9 is a plan view illustrating a first area of a base substrate of a display device according to embodiments.

FIG. 9 is a plan view illustrating a first area of a base substrate of a display device according to embodiments.

According to embodiments, a first area A1 of a base substrate 110 may selectively overlap the first channel region CH1 illustrated in FIG. 2. In order to form the base substrate 110, when the mask PR is formed by a photolithography, a same light-exposure mask as that used for forming a second gate metal pattern including a capacitor electrode pattern CP may be used. Thus, the first area A1 may have the same (or substantially the same) planar shape as the second gate metal pattern including the capacitor electrode pattern CP.

For example, an edge of the first area A1 of the base substrate 110 may extend along an edge of the capacitor electrode pattern CP, as illustrated in FIG. 9. Furthermore, the first area A1 may further overlap at least one of a shielding pattern SP or an initialization voltage wiring Vint. Furthermore, an opening-overlapping area OA of the base substrate 110, which overlaps an opening OP of the capacitor electrode pattern CP and is surrounded by the first area A1, may have a thickness smaller than a thickness of the first area A1.

According to embodiments, the opening-overlapping area OA may not overlap the first channel region CH1 so that the first area A1 may entirely overlap the first channel region CH1. For example, the opening-overlapping area OA may be spaced apart from the first channel region CH1 in a plan view.

Figure 10:
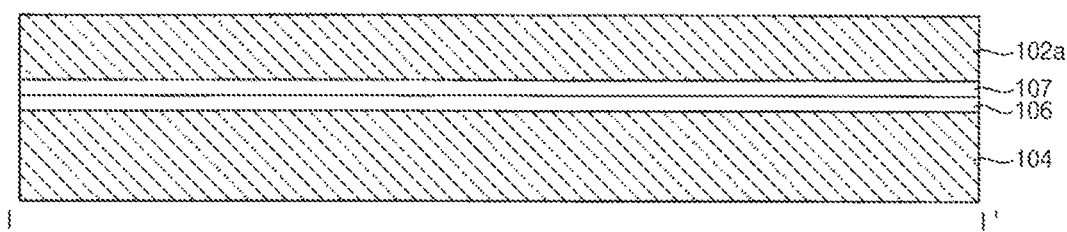
FIGS. 10 and 11 are cross-sectional views illustrating a method for manufacturing a base substrate of a display device according to embodiments.
Figure 11:
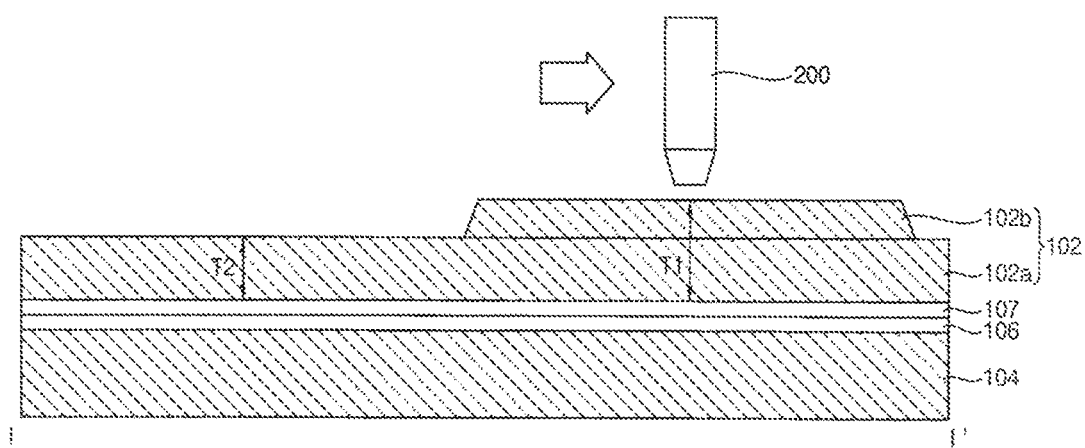

FIGS. 10 and 11 are cross-sectional views illustrating a method for manufacturing a base substrate of a display device according to embodiments.

Referring to FIG. 10, a polymeric common layer 102a is formed on an adhesion-enhancing layer 107 located on a lower polymeric film 104 and a lower barrier layer 106.

Referring to FIG. 11, a polymeric pattern 102b is formed on the polymeric common layer 102a. For example, a composition including a polymer or a polymer precursor may coated partially on the polymeric common layer 102a, and then dried and/or cured to form the polymeric pattern 102b. For example, a polyimide (PI) varnishing method using a coating apparatus 200 may be used for forming the polymeric pattern 102b.

For example, the polymeric pattern 102b located in the first area A1 may have the same (or substantially the same) planar shape as a second gate metal pattern including a capacitor electrode pattern CP, as illustrated in FIG. 9. For example, an edge of the polymeric pattern 102b of the base substrate 110 may extend along an edge of the capacitor electrode pattern CP. Furthermore, the polymeric pattern 102b may further overlap at least one of a shielding pattern SP or an initialization voltage wiring Vint.

However, embodiments according to the present disclosure are not limited thereto. For example, the polymeric pattern 102b may be formed selectively in an area overlapping a first gate electrode.

As the polymeric pattern 102b is formed selectively in the first area A1, an upper polymeric film 102 including the polymeric pattern 102b may have a first thickness T1 in the first area A1 and a second thickness T2, which is smaller than the first thickness T1, in a remaining area.

Figure 12:
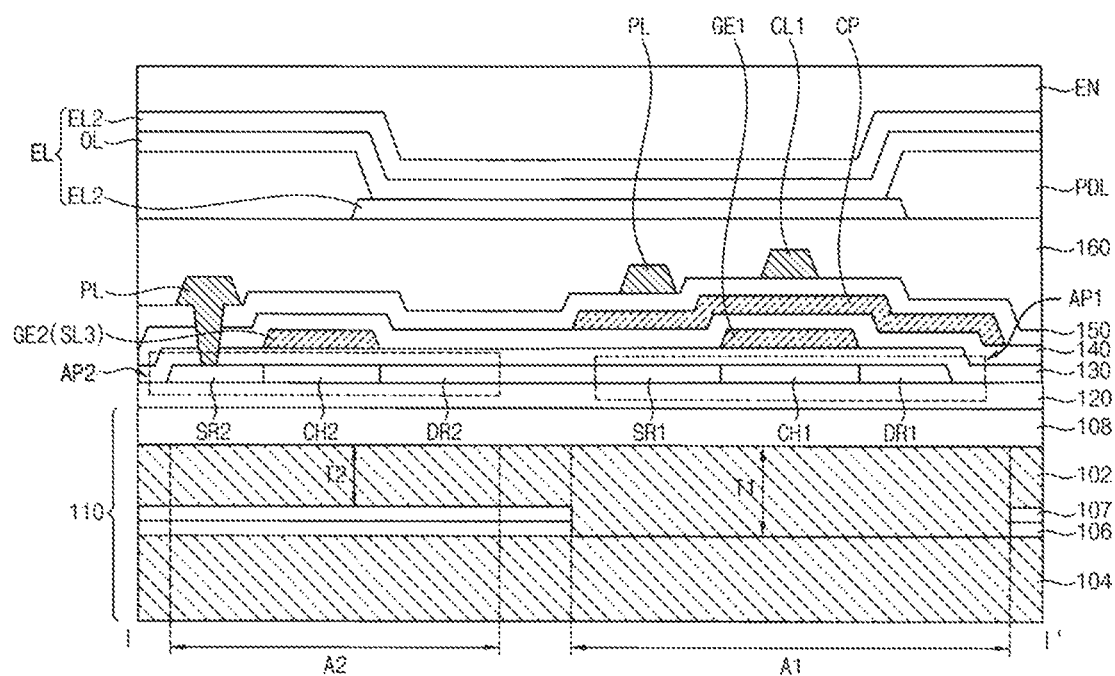
FIG. 12 is a cross-sectional view illustrating a driving element and a light-emitting element of a display device according to embodiments.

FIG. 12 is a cross-sectional view illustrating a driving element and a light-emitting element of a display device according to embodiments.

Referring to FIG. 12, a display device includes a base substrate 110, a driving element and a light-emitting element. The display device may have the same (or substantially the same) configuration as the display device illustrated in FIGS. 2 and 3, except for the base substrate 110. Thus, some duplicated explanation may be omitted.

The base substrate 110 includes at least one polymeric film. For example, the base substrate 110 may include an upper polymeric film 102, a lower polymeric film 104 located under the upper polymeric film 102, a lower barrier layer 106 located between the upper polymeric film 102 and the lower polymeric film 104, an upper barrier layer 108 covering an upper surface of the upper polymeric film 102, and an adhesion-enhancing layer 107 located between the upper polymeric film 102 and the lower barrier layer 106.

The adhesion-enhancing layer 107 and the lower barrier layer 106 may each include an opening, which overlaps a first area A1. The upper polymeric film 102 may include a protrusion filling the opening. Thus, a first thickness T1 of the upper polymeric film 102 in the first area A1 may be greater than a second thickness T2 of the upper polymeric film 102 in a remaining area. The first area A1 may overlap a first channel region CH1, which defines a channel of a driving transistor.

The upper polymeric film 102 may contact the lower polymeric film 104 through the openings of the adhesion-enhancing layer 107 and the lower barrier layer 106.

When the adhesion-enhancing layer 107 including amorphous silicon is arranged under the upper polymeric film 102, a fringe field may be increased by the adhesion-enhancing layer 107. According to embodiments, because the adhesion-enhancing layer 107 is removed under the first channel region CH1, a fringe field affecting the first channel region CH1 may be reduced.

Figure 13:
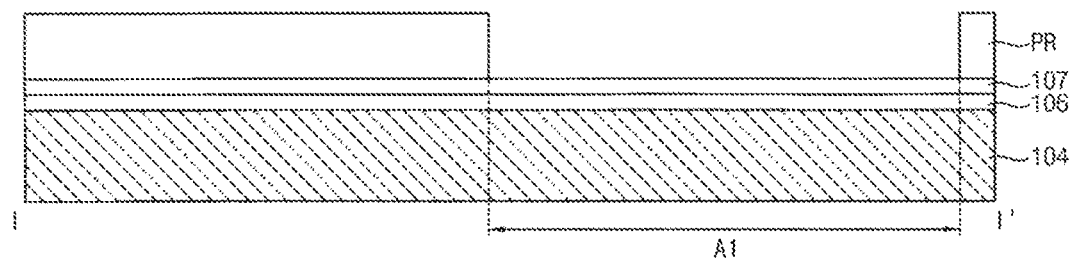
FIGS. 13, 14 and 15 are cross-sectional views illustrating a method for manufacturing the base substrate of the display device illustrated in FIG. 12 according to embodiments.
Figure 14:
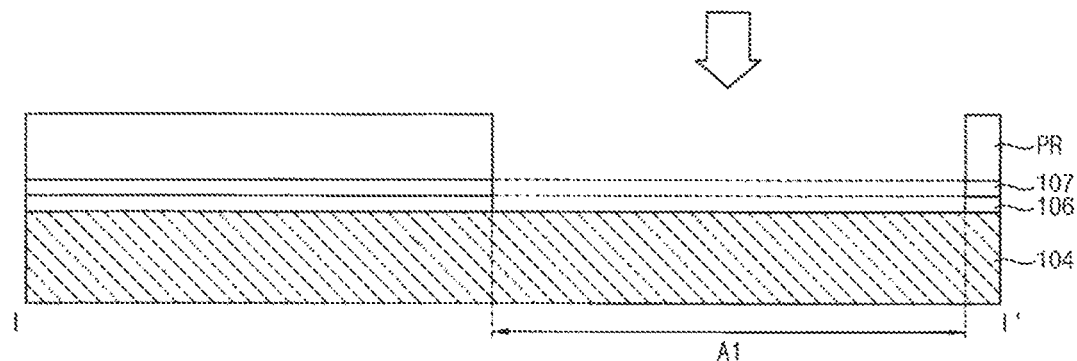
Figure 15:
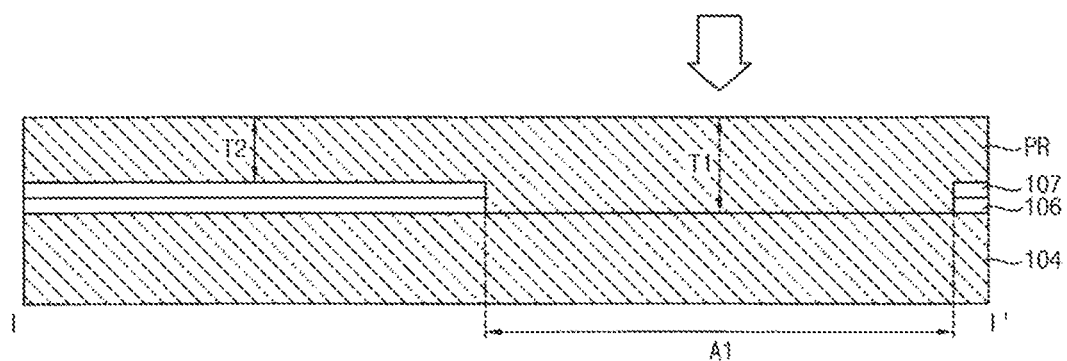

FIGS. 13, 14 and 15 are cross-sectional views illustrating a method for manufacturing the base substrate of the display device illustrated in FIG. 12.

Referring to FIG. 13, a lower barrier layer 106 is formed on a lower polymeric film 104. An adhesion-enhancing layer 107 is formed on the lower barrier layer 106. A mask PR is formed on the adhesion-enhancing layer 107.

The mask PR may be formed from a photoresist composition, and may include an opening overlapping a first area A1. For example, when the mask PR is formed by a photolithography, a same light-exposure mask as that used for forming a second gate metal pattern including a capacitor electrode pattern may be used (a type of a photoresist composition may be inversed). Thus, the first area A1 may have the same (or substantially the same) planar shape as the second gate metal pattern, as illustrated in FIG. 9. For example, an edge of the first area A1 of the base substrate 110 may extend along an edge of the capacitor electrode pattern CP, as illustrated in FIG. 9. Furthermore, the first area A1 may further overlap at least one of a shielding pattern SP or an initialization voltage wiring Vint.

Referring to FIG. 14, the adhesion-enhancing layer 107 and the lower barrier layer 106 under the adhesion-enhancing layer 107 are partially removed under the opening of the mask PR. Thus, openings are formed through the adhesion-enhancing layer 107 and the lower barrier layer 106.

Referring to FIG. 15, a composition including a polymer or a polymer precursor is coated on the adhesion-enhancing layer 107, and then dried and/or cured to form an upper polymeric film 102.

The upper polymeric film 102 includes a protrusion filling the openings of the adhesion-enhancing layer 107 and the lower barrier layer 106. Thus, the upper polymeric film 102 has a first thickness T1 in the first area A1 and a second thickness T2, which is smaller than the first thickness T1, in a remaining area.

Figure 16:
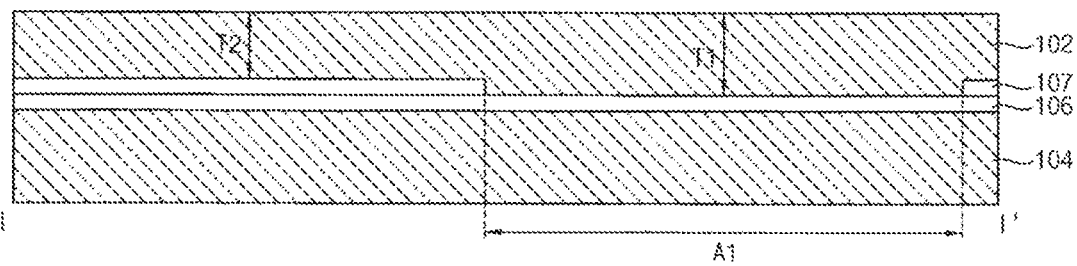
FIG. 16 is a cross-sectional view illustrating a base substrate of display device according to embodiments.

Referring to FIG. 16, a base substrate may include a lower barrier layer 106, which does not include an opening in a first area A1. An adhesion-enhancing layer 107 may be located between an upper polymeric film 102 and the lower barrier layer 106, and may include an opening overlapping the first area A1. Thus, the upper polymeric film 102 may include a protrusion filling the opening of the adhesion-enhancing layer 107, and may be entirely spaced apart from the lower polymeric film 104.

According to embodiments, the lower barrier layer 106 entirely covers an upper surface of the lower polymeric film 104. Thus, impurities such as humidity or other contaminants may be prevented from moving into the upper polymeric film 102.

Figure 17:
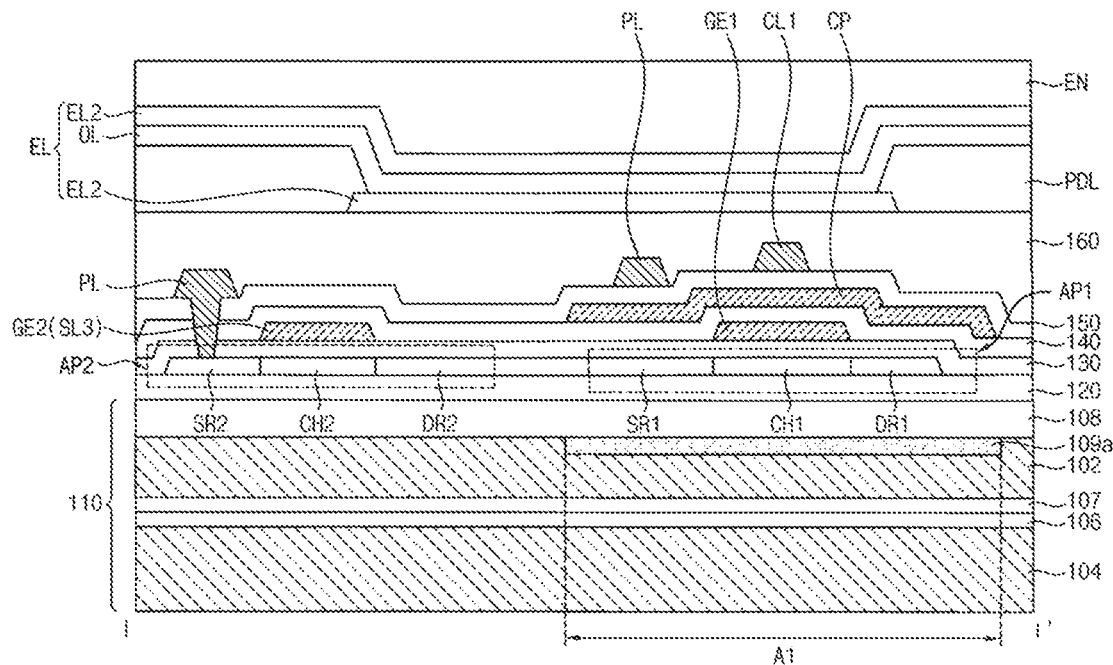
FIG. 17 is a cross-sectional view illustrating a driving element and a light-emitting element of a display device according to embodiments.
Figure 18:
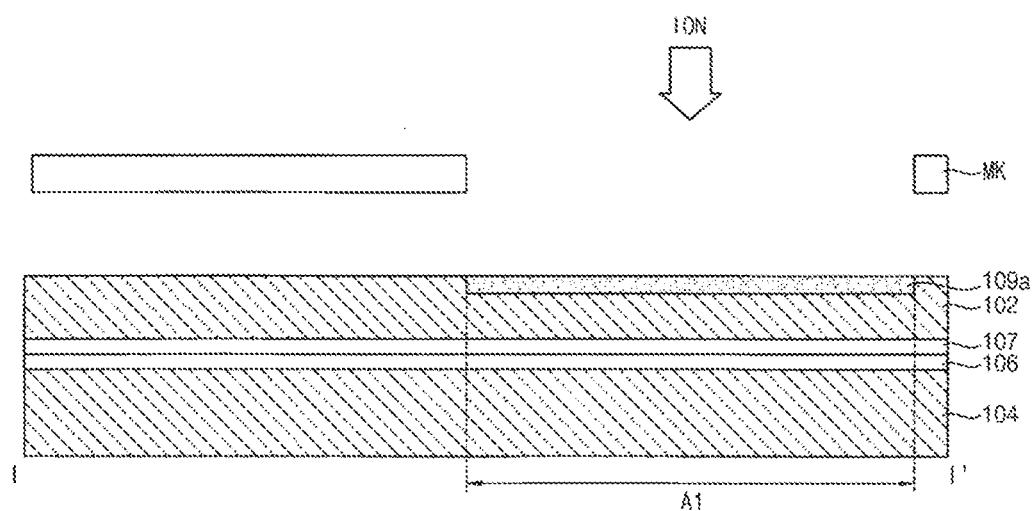
FIG. 18 is a cross-sectional view illustrating a method for manufacturing the base substrate of the display device illustrated in FIG. 17 according to embodiments.

FIG. 17 is a cross-sectional view illustrating a driving element and a light-emitting element of a display device according to embodiments. FIG. 18 is a cross-sectional view illustrating a method for manufacturing the base substrate of the display device illustrated in FIG. 17.

Referring to FIG. 17, a display device includes a base substrate 110, a driving element and a light-emitting element. The display device may have the same (or substantially the same) configuration as the display device illustrated in FIGS. 2 and 3, except for the base substrate 110. Thus, some duplicated explanation may be omitted.

The base substrate 110 includes at least one polymeric film. For example, the base substrate 110 may include an upper polymeric film 102, a lower polymeric film 104 located under the upper polymeric film 102, a lower barrier layer 106 located between the upper polymeric film 102 and the lower polymeric film 104, an upper barrier layer 108 covering an upper surface of the upper polymeric film 102, and an adhesion-enhancing layer 107 located between the upper polymeric film 102 and the lower barrier layer 106.

According to embodiments, the display device includes a field-blocking pattern 109a located in a first area A1 of the upper polymeric film 102. The first area A1 may overlap a first channel region CH1 of a first active region AP1, which may define a channel of a driving transistor.

According to embodiments, the field-blocking pattern 109a may be doped with ions so that the field-blocking pattern 109a may have a conductivity greater than other areas of the upper polymeric film 102.

Referring to FIG. 18, the field-blocking pattern 109a may formed by ion-implanting method. For example, a mask MK including an opening overlapping the first area A1 may be located on the upper polymeric film 102. Ions may be provided to the first area A1 of the upper polymeric film 102 through the mask MK to form the field-blocking pattern 109a doped with ions. Thus, the field-blocking pattern 109a may have a cross-section recessing from an upper surface of the upper polymeric film 102.

For example, the mask MK may have the same (or substantially the same) shape as a light-exposure mask used for forming a second gate metal pattern including a capacitor electrode pattern. Thus, the field-blocking pattern 109a may have the same (or substantially the same) planar shape as the second gate metal pattern, as illustrated in FIG. 9. For example, an edge of the field-blocking pattern 109a may extend along an edge of the capacitor electrode pattern CP, as illustrated in FIG. 9. Furthermore, the field-blocking pattern 109a may further overlap at least one of a shielding pattern SP or an initialization voltage wiring Vint.

For example, the ions may include p+ dopant such as boron, or n+ dopant such as phosphor.

Figure 19:
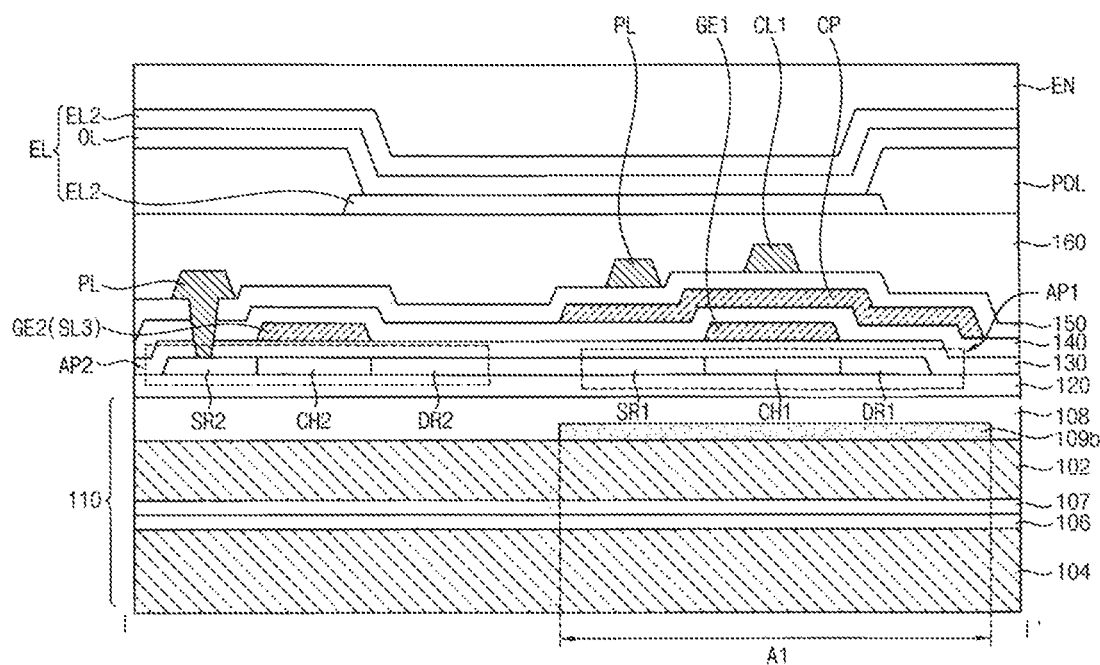
FIG. 19 is a cross-sectional view illustrating a driving element and a light-emitting element of a display device according to embodiments.

Referring to FIG. 19, a base substrate 110 of a display device may include an upper polymeric film 102, a lower polymeric film 104 located under the upper polymeric film 102, a lower barrier layer 106 located between the upper polymeric film 102 and the lower polymeric film 104, an upper barrier layer 108 covering an upper surface of the upper polymeric film 102, and an adhesion-enhancing layer 107 located between the upper polymeric film 102 and the lower barrier layer 106. The display device further includes a field-blocking pattern 109b located between the upper barrier layer 108 and the upper polymeric film 102.

The field-blocking pattern 109b may include a semiconductive material or a conductive material. For example, the field-blocking pattern 109b may include amorphous silicon. For example, the field-blocking pattern 109b may include phosphine. For example, the field-blocking pattern 109b may include metal.

According to embodiments, a layer including a semiconductive material or a conductive material is formed on the upper polymeric film 102, and then patterned to form the field-blocking pattern 109b. For example, a light-exposure mask used for forming a mask pattern on the layer may be the same (or substantially the same) as a light-exposure mask used for forming a second gate metal pattern including a capacitor electrode pattern. Thus, the field-blocking pattern 109b may have the same (or substantially the same) planar shape as the second gate metal pattern, as illustrated in FIG. 9.

According to embodiments, a field-blocking pattern having a conductivity greater than a polymeric film may be located under a channel region of a driving element. Thus, a fringe field applied to the channel region may be blocked or reduced. Thus, variation of characteristics of the driving element may be prevented or reduced.

When the field-blocking pattern is formed entirely on an upper surface of an upper polymeric film, display quality may be deteriorated by horizontal cross-talk. According to embodiments, because the field-blocking pattern is arranged selectively under the channel region, horizontal cross-talk may not be caused.

Furthermore, because the field-blocking pattern is located under the upper polymeric film, a distance between the field-blocking pattern and the channel region may be large. Thus, even if the field-blocking pattern is in a floating state, the channel region may not be affected by the field-blocking pattern. Thus, a fringe field applied to the channel region may be effectively blocked even without another wiring providing a constant voltage. For example, a distance between the field-blocking pattern and the channel region may be at least 5,000 Å, or may be at least 8,000 Å.

Aspects of embodiments include an organic-light emitting display device. However, embodiments according to the present disclosure are not limited thereto. For example, aspects of embodiments may include various display devices such as a electroluminescent display device, a micro LED display device or the like.

Embodiments may be applied to various display devices. For example, aspects of embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A display device comprising:
a base substrate including a first polymeric film;
an active pattern on the base substrate and including a first channel region; and
a first gate electrode overlapping the first channel region,
wherein the first polymeric film has a first thickness in a first area overlapping the first channel region and a second thickness, which is smaller than the first thickness, in a second area different from the first area,
wherein the active pattern further includes a second channel region overlapping the second area, wherein a height of the first channel region is greater than a height of the second channel region.

2. The display device of claim 1, further comprising a second gate electrode overlapping a second channel region of the active pattern, wherein the second area overlaps the second channel region.

3. The display device of claim 2, further comprising a light-emitting element,
wherein a driving transistor defined by the first channel region and the first gate electrode is configured to provide a driving current to the light-emitting element,
wherein a source terminal or a drain terminal of a switching transistor defined by the second channel region and the second gate electrode is electrically connected to a source terminal or a drain terminal of the driving transistor.

4. The display device of claim 3, wherein the second gate electrode is configured to receive an emission control signal.

5. The display device of claim 3, wherein the light-emitting element includes an organic light-emitting diode.

6. The display device of claim 1, wherein a ratio of the first thickness to the second thickness is at least 1.2.

7. The display device of claim 6, wherein a difference between the first thickness and the second thickness is 5,000 Å to 20,000 Å.

8. A display device comprising:
a base substrate including a first polymeric film;
an active pattern on the base substrate and including a first channel region; and
a first gate electrode overlapping the first channel region,
wherein the first polymeric film has a first thickness in a first area overlapping the first channel region and a second thickness, which is smaller than the first thickness, in a second area different from the first area,
wherein the base substrate further includes a second polymeric film under the first polymeric film, and an adhesion-enhancing layer, which is between the first polymeric film and the second polymeric film and includes amorphous silicon.

9. A display device comprising:
a base substrate including a first polymeric film;
an active pattern on the base substrate and including a first channel region;
a first gate electrode overlapping the first channel region; and
a capacitor electrode pattern, wherein an edge of the first area extends along an edge of the capacitor electrode pattern,
wherein the first polymeric film has a first thickness in a first area overlapping the first channel region and a second thickness, which is smaller than the first thickness, in a second area different from the first area.

10. A display device comprising:
a base substrate including a first polymeric film, a second polymeric film and an adhesion-enhancing layer, which is between the first polymeric film and the second polymeric film and includes an opening;
an active pattern on the base substrate and including a first channel region overlapping the opening of the adhesion-enhancing layer; and
a first gate electrode overlapping the first channel region.

11. The display device of claim 10, wherein the adhesion-enhancing layer includes amorphous silicon.

12. The display device of claim 11, wherein the base substrate further includes a barrier layer between the adhesion-enhancing layer and the second polymeric film.

13. The display device of claim 12, wherein the barrier layer includes overlapping the first channel region.

14. The display device of claim 13, wherein the first polymeric film contacts the second polymeric film through openings of the adhesion-enhancing layer and the barrier layer.

15. The display device of claim 12, wherein the first polymeric film is entirely spaced apart from the second polymeric film.

16. The display device of claim 10, wherein the at least one of the first polymeric film or the second polymeric film includes polyimide.

17. A display device comprising:
a base substrate including a first polymeric film and an upper barrier layer covering an upper surface of the first polymeric film;
a field-blocking pattern partially between the first polymeric film and the upper barrier layer;
an active pattern on the base substrate, overlapping the field-blocking pattern and including a first channel region spaced apart from the field-blocking pattern by a distance equal to or more than 5,000 Å; and
a first gate electrode overlapping the first channel region.

18. The display device of claim 17, wherein the field-blocking pattern is formed by doping a portion of the first polymeric film with ions.

19. The display device of claim 17, wherein the field-blocking pattern includes at least one of a conductive material or a semiconductive material.

20. The display device of claim 19, wherein the field-blocking pattern includes amorphous silicon.

21. The display device of claim 19, wherein the field-blocking pattern includes phosphine.

22. The display device of claim 19, wherein the field-blocking pattern is in a floating state.

23. The display device of claim 17, further comprising a buffer layer between the upper barrier layer and the first channel region.

24. The display device of claim 17, wherein the base substrate further includes a second polymeric film under the first polymeric film, a lower barrier layer between the first polymeric film and the second polymeric film, and an adhesion-enhancing layer, which is between the first polymeric film and the second polymeric film and includes amorphous silicon.

25. The display device of claim 17, further comprising a capacitor electrode pattern overlapping the first gate electrode, wherein an edge of the field-blocking pattern extends along an edge of the capacitor electrode pattern.

* * * * *